(12) United States Patent
Mine et al.

(10) Patent No.: US 9,635,779 B2
(45) Date of Patent: Apr. 25, 2017

(54) ACCOMMODATING DEVICE, SEGMENT, AND METHOD FOR FORMING MULTIPLE-STAGE ACCOMMODATING PORTIONS

(71) Applicant: HIRATA CORPORATION, Shinagawa-ku, Tokyo (JP)

(72) Inventors: Koshi Mine, Tokyo (JP); Katsuyoshi Tachibana, Tokyo (JP); Yasuaki Kuroki, Tokyo (JP)

(73) Assignee: HIRATA CORPORATION, Shinagawa-Ku, Tokyo (JP)

( * ) Notice: Subject to any disclaimer, the term of this patent is extended or adjusted under 35 U.S.C. 154(b) by 0 days.

(21) Appl. No.: 14/747,354

(22) Filed: Jun. 23, 2015

(65) Prior Publication Data
US 2015/0374122 A1 Dec. 31, 2015

(30) Foreign Application Priority Data

Jun. 25, 2014 (JP) ................................ 2014-130659
Apr. 13, 2015 (JP) ................................ 2015-082045

(51) Int. Cl.
H05K 7/18 (2006.01)
H05K 7/14 (2006.01)

(52) U.S. Cl.
CPC ............. *H05K 7/18* (2013.01); *H05K 7/1418* (2013.01)

(58) Field of Classification Search
CPC ...... H05K 7/18; H05K 7/1418; A47F 5/0025; B62B 3/006; A47B 31/00; A47B 96/024

USPC ....................................................... 211/41.18
See application file for complete search history.

(56) References Cited

U.S. PATENT DOCUMENTS

| | | | | | |
|---|---|---|---|---|---|
| 3,222,117 | A | * | 12/1965 | Schwartz | A47B 47/03 211/126.15 |
| 5,259,668 | A | * | 11/1993 | Teufel | B62B 3/006 312/249.11 |
| 5,494,710 | A | * | 2/1996 | Mallory, Jr. | C23C 18/36 106/1.27 |
| 6,021,909 | A | * | 2/2000 | Tang | H02B 1/36 211/183 |
| 6,186,344 | B1 | | 2/2001 | Park et al. | |

(Continued)

FOREIGN PATENT DOCUMENTS

| CN | 101559871 A | 10/2009 |
|---|---|---|
| JP | H03-67807 A | 3/1991 |

(Continued)

*Primary Examiner* — Korie H Chan
(74) *Attorney, Agent, or Firm* — Buchanan Ingersoll & Rooney PC

(57) ABSTRACT

This invention provides an accommodating device provided with a plurality of accommodating portions configured to accommodate plate-shaped members to be accommodated by being separated away in a thickness direction thereof, having: at least one wall body constructing the accommodating device; and a plurality of segments having the accommodating portions respectively and arranged adjacently each other along a wall surface of the wall body, wherein each of the plurality of segments has an engagement portion to be engaged with an adjacent segment, and the plurality of segments are connected to each other through engagement between the engagement portions of each segments and are detachably mounted on the wall body.

9 Claims, 14 Drawing Sheets

(56) References Cited

U.S. PATENT DOCUMENTS

| | | | |
|---|---|---|---|
| 6,290,076 B1 * | 9/2001 | Sayers | A47B 43/02 211/41.1 |
| 6,378,963 B1 * | 4/2002 | Relyea | A47B 67/04 312/107.5 |
| 6,513,770 B1 * | 2/2003 | Franz | G02B 6/4471 248/200 |
| 8,047,755 B2 | 11/2011 | Ichioka | |
| 9,221,603 B2 | 12/2015 | Hashimoto et al. | |
| 2012/0293954 A1 * | 11/2012 | Peng | H05K 7/1489 361/679.58 |

FOREIGN PATENT DOCUMENTS

| | | | |
|---|---|---|---|
| JP | 3035569 U | | 3/1997 |
| JP | 4289783 B2 | | 7/2009 |
| JP | 2013194138 A | * | 9/2013 |
| KR | 10-2013-0059413 A | | 6/2013 |

\* cited by examiner

FIG. 7
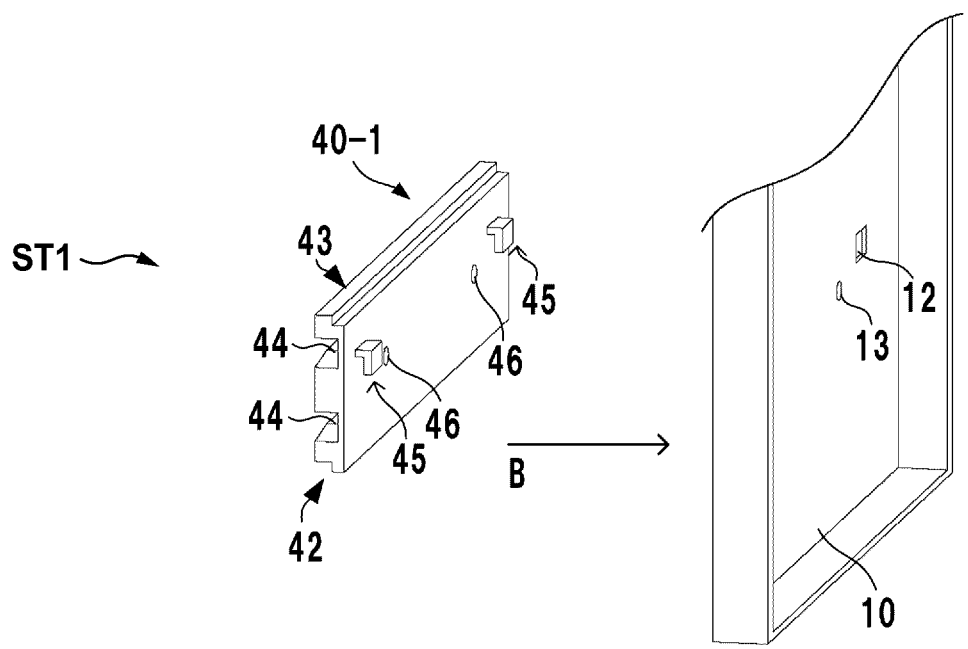
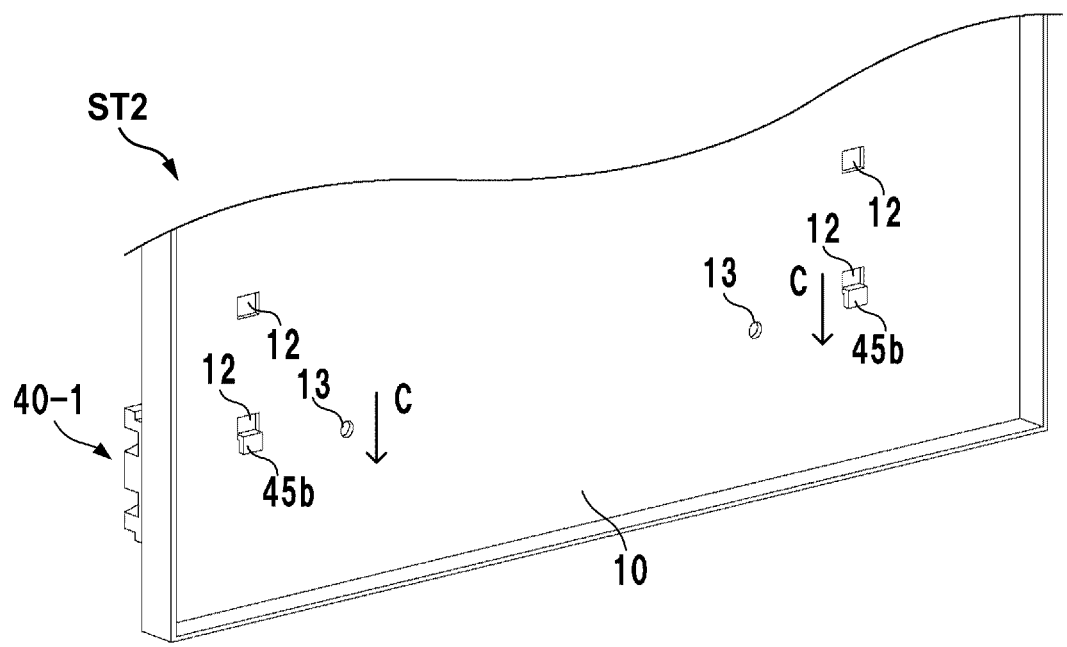

FIG. 8
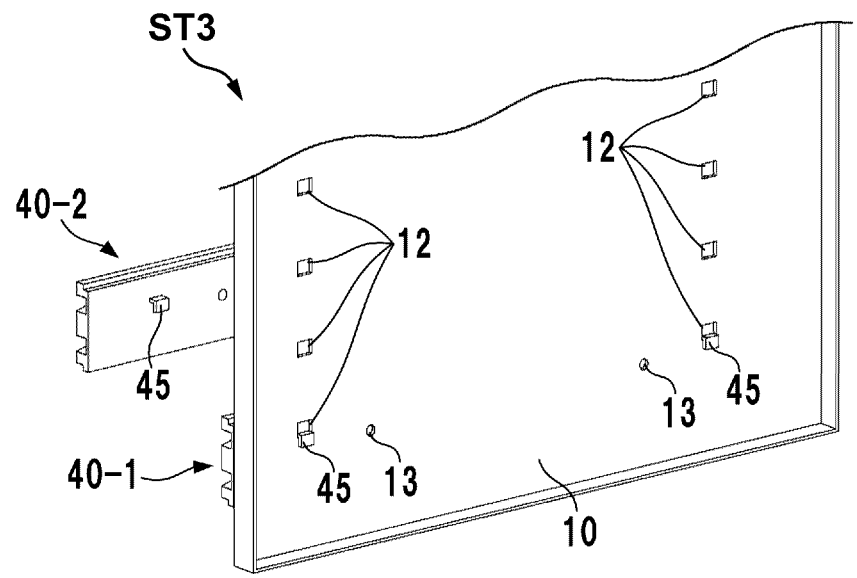
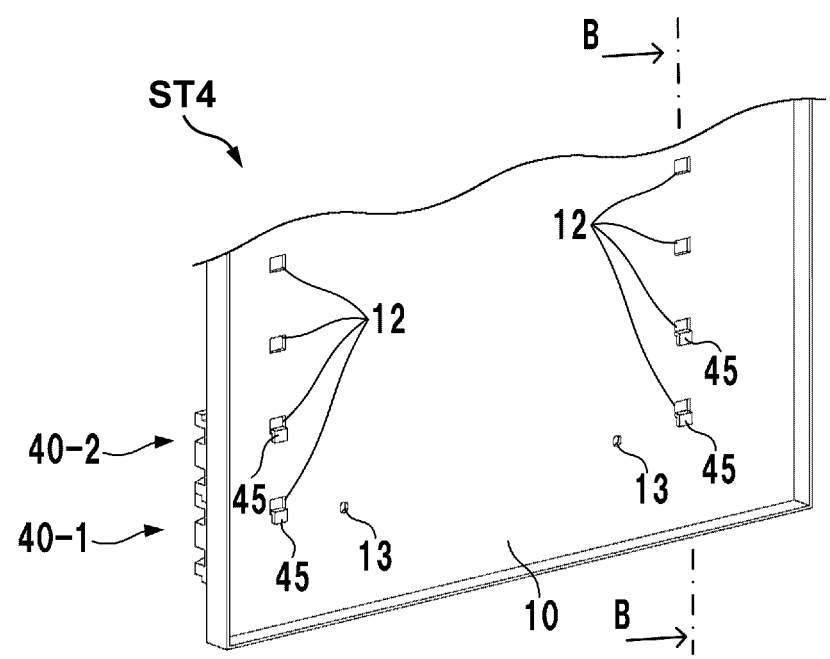

FIG. 9A
FIG. 9B
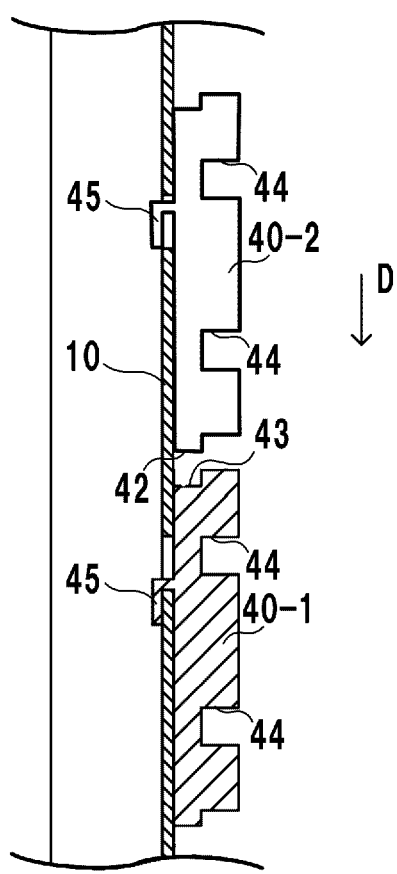
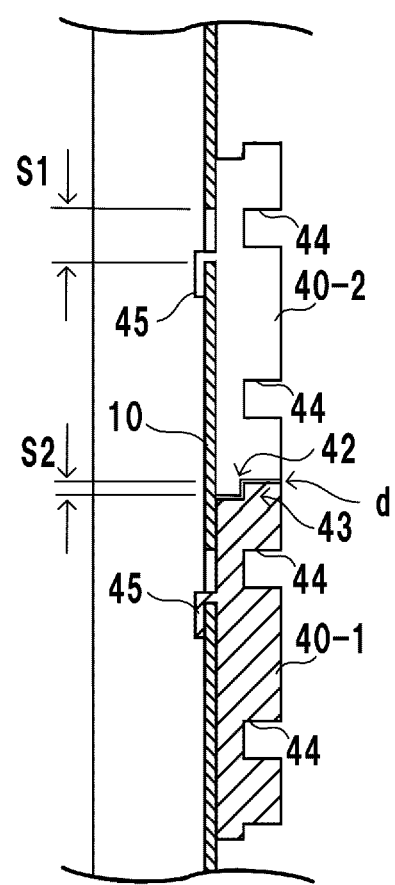

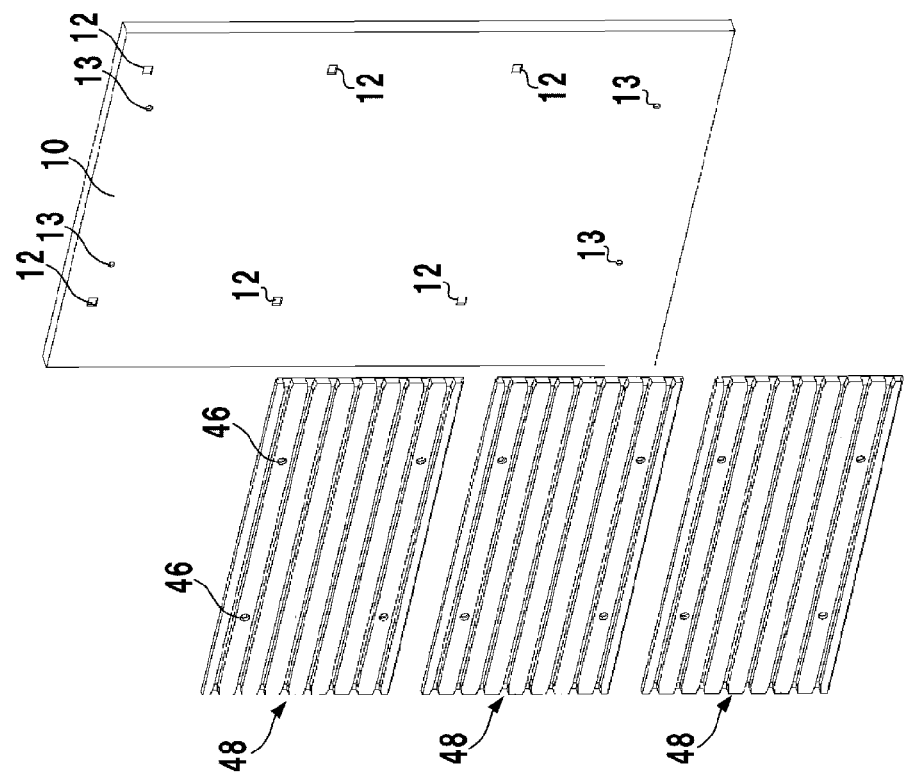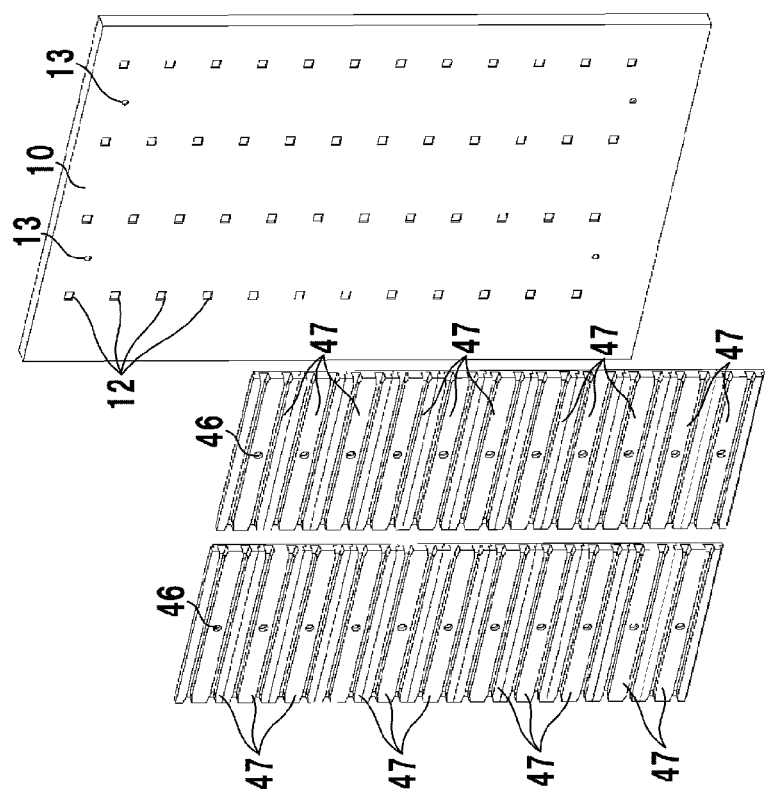

ACCOMMODATING DEVICE, SEGMENT, AND METHOD FOR FORMING MULTIPLE-STAGE ACCOMMODATING PORTIONS

BACKGROUND OF THE INVENTION

Field of the Invention

The present invention relates to an accommodating device, a segment, and a method for forming multiple-stage accommodating portions.

Description of the Related Art

In transfer or storage of a rectangular plate-shaped member such as an electronic substrate, a printed circuit board, a panel, a glass or a tray, a plurality of the plate-shaped members can be accommodated in an accommodating device in a state in which the plate-shaped members are stacked by being separated away in a thickness direction thereof for collective transfer and storage. As a device for accommodating a plurality of plate-shaped members therein, a device is known in which a plurality of accommodating portions for accommodating end portions of the plate-shaped members are mounted on a wall surface of the accommodating device so that the plurality of plate-shaped members are stacked and accommodated.

Japanese Utility Model Registration No. 3035569 proposes a technology for accommodating plate-shaped members in a stacked state by a single member in which a plurality of slots which are accommodating portions are formed in a vertical direction such as side plates. Japanese Patent No. 4289783 describes a technology in which, by detachably providing a rail member mounted on a wall surface of an accommodating device and provided with an accommodating portion, a vertical position of the rail member can be switched in accordance with a size of a member to be accommodated in a thickness direction.

In the technology described in Japanese Utility Model Registration No. 3035569, since the plurality of slots are molded integrally into one member, even if only one spot of the plurality of slots is damaged and the other slots remain damageless, the entirety of the integrally molded member or a side plate, for example, needs to be replaced. Therefore, a cost for replacing a component is high. In the technology described in Japanese Patent No. 4289783, when the rail member is to be mounted on the wall surface, by moving and fitting a part of a claw provided on the rail member from an opening side to a rear surface side of a body, by being matched with a hole provided in the wall surface, positioning in the vertical direction and fixation of the rail member to the wall surface are performed at the same time and the rail member is attached singularly. Such a rail member is firmly fixed to the wall surface reliably by a plurality of types of claws one by one so that the rail member is not easily removed from the wall surface and thus, a mounting/assembling work of the rail member to the wall surface takes time.

SUMMARY OF THE INVENTION

Therefore, an object of the present invention is to improve mounting work efficiency of the accommodating portion of an accommodating device.

According to an aspect of the present invention, there is provided an accommodating device provided with a plurality of accommodating portions configured to accommodate plate-shaped members to be accommodated by being separated away in a thickness direction thereof, comprising: at least one wall body constructing the accommodating device; and a plurality of segments having the accommodating portions respectively and arranged adjacently each other along a wall surface of the wall body, wherein each of the plurality of segments has an engagement portion to be engaged with an adjacent segment, and the plurality of segments are connected to each other through engagement between the engagement portions of each segments and are detachably mounted on the wall body.

According to another aspect of the present invention, there is provided a segment constructing an accommodating device provided with a plurality of accommodating portions on a wall surface of a wall body, each accommodating a plate-shaped member to be accommodated by being separated away in a thickness direction thereof, wherein a plurality of the segments are arranged adjacently each other along the wall surface of the wall body, and the segment includes: at least one of the plurality of accommodating portions configured to accommodate the member to be accommodated; an engagement portion configured to be engaged with an adjacent segment; and a loosely-fitting unit configured to be detachably and loosely fitted with the wall surface of the wall body.

According to still another aspect of the present invention, there is provided a method for forming multiple-stage accommodating portions on a wall surface of a wall body by connecting a plurality of segments, each having at least one accommodating portion, wherein each of the plurality of segments includes: the accommodating portion configured to accommodate a plate-shaped member to be accommodated; an engagement portion to be engaged with an adjacent segment; and a loosely-fitting unit detachably attached to the wall body; and the wall body includes a plurality of loosely-fitted portions to be loosely fitted with the loosely-fitting unit respectively, the method comprising: a first engagement step of engaging a first one of the plurality of segments with the wall surface, by inserting the loosely-fitting unit of the first segment through the loosely-fitted portion of the wall body opposed to the loosely-fitting unit, and moving the first segment in one direction; and a second engagement step of connecting the first segment and a second one of the plurality of segments adjacent to the first segment each other, by inserting the loosely-fitting unit of the second segment through the loosely-fitted portion of the wall body opposed to the loosely-fitting unit, moving the second segment toward the adjacent first segment to be engaged with the wall surface, and engaging the engagement portions of the first and second segments with each other; wherein the multiple-stage accommodating portions are formed along the wall surface of the wall body by repeating the second engagement step.

Further features of the present invention will become apparent from the following description of exemplary embodiments (with reference to the attached drawings).

BRIEF DESCRIPTION OF THE DRAWINGS

FIG. 7 is an explanatory view illustrating a process of mounting the segment in FIG. 1 to the side wall;

FIG. 8 is an explanatory view illustrating the process of mounting the segment in FIG. 1 to the side wall;

FIGS. 9A and 9B are explanatory views illustrating the process of mounting the segment in FIG. 1 to the side wall;

FIG. 12A is an exploded perspective view illustrating a second embodiment of the present invention;

FIG. 12B is an exploded perspective view illustrating a third embodiment of the present invention;

DESCRIPTION OF THE EMBODIMENTS

Figure 1:
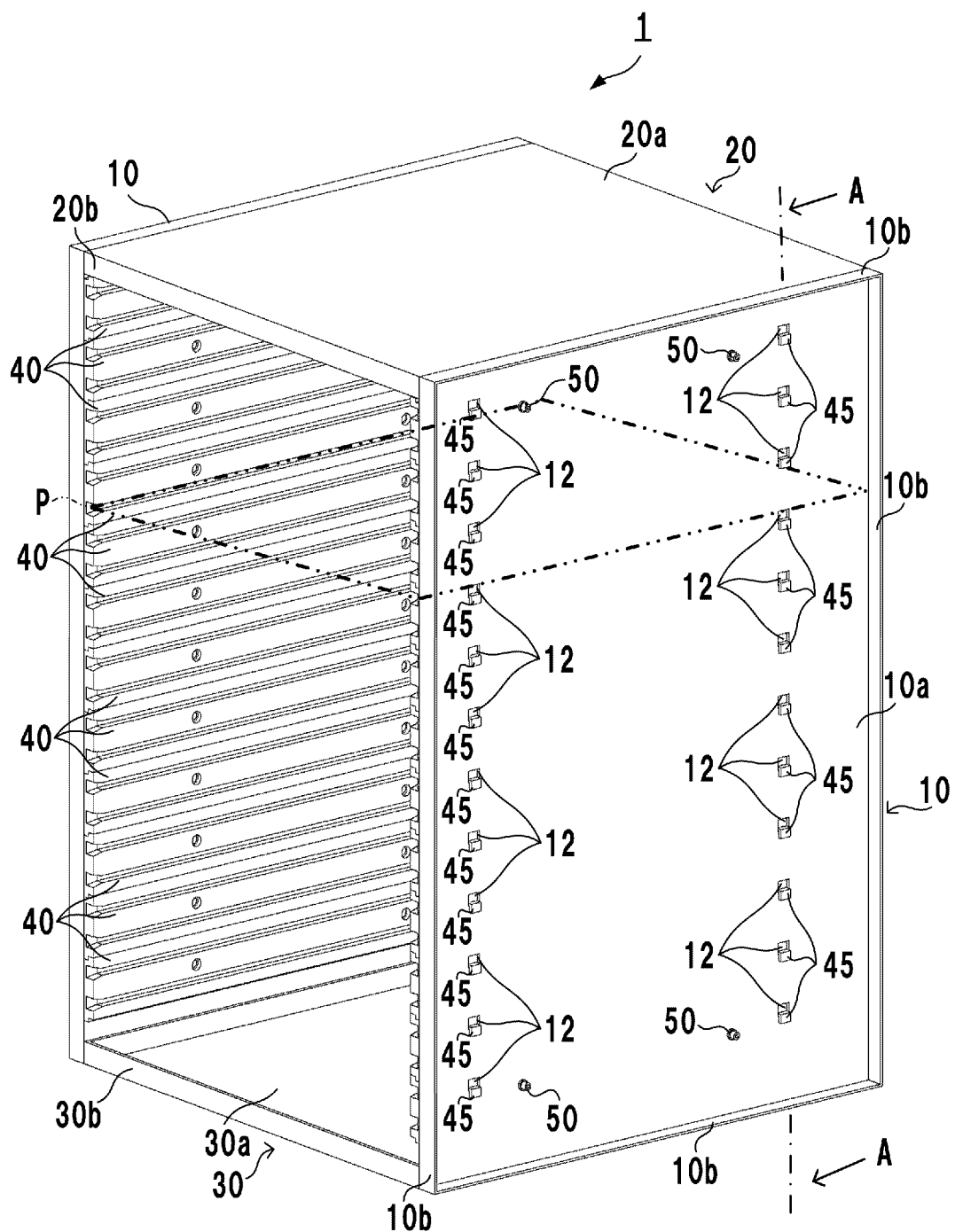
FIG. 1 is a perspective view of an accommodating device according to a first embodiment of the present invention.
Figure 2:
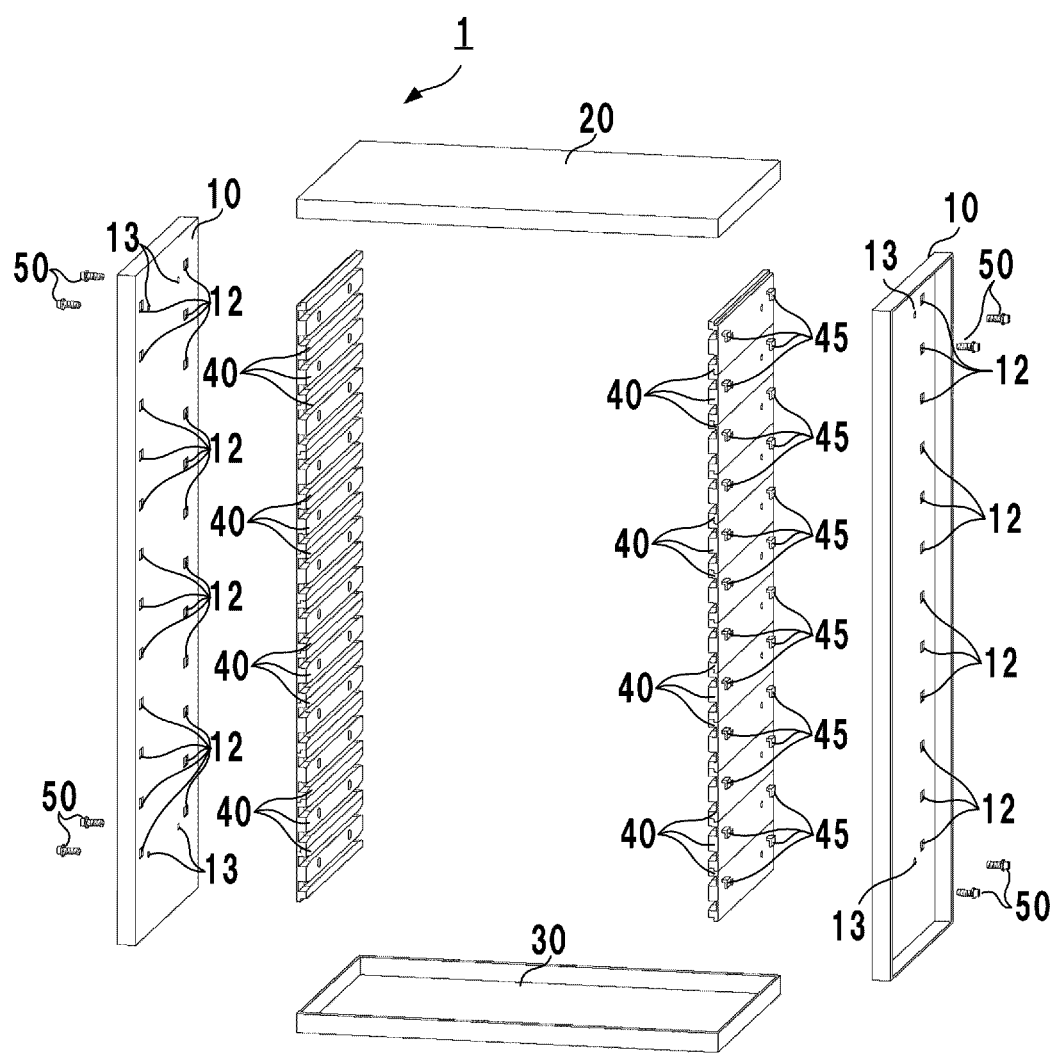
FIG. 2 is an exploded perspective view of the accommodating device in FIG. 1.

FIG. 1 is a perspective view illustrating an accommodating device 1 according to a first embodiment of the present invention. FIG. 2 is an exploded perspective view of the accommodating device 1.

The accommodating device 1 includes a pair of side walls 10 and 10 which are wall bodies, connecting members connecting the upper ends and lower ends of the side walls 10 (in this embodiment, a ceiling wall 20 and a bottom wall 30 having a plate shape), and a plurality of segments 40 arranged on opposing wall surfaces of the side walls 10. The accommodating device 1 is provided with the segments 40 including accommodating portions 44 in a plurality of stages (multiple stage accommodating portions) (see FIGS. 4A and 4B), each accommodating a plate-shaped member P (indicated by a two-dot chain line in FIG. 1) to be accommodated by being separated away in its thickness direction. A part of the segment 40 is provided with a screw opening portion 46 (see FIG. 5A) which will be described later and is used when the segment 40 is fixed to the side wall 10 by a fixing screw 50.

The accommodating device 1 forms a box body (tetrahedron) with a pair of surfaces (a surface on a front side and a surface on a depth side in FIG. 2) open by the pair of side walls 10 and 10, the ceiling wall 20, and the bottom wall 30. On an inner wall surface of each of the pair of side walls 10 and 10 opposing to each other, a plurality of the segments 40 are arranged adjacently to each other along the respective wall surfaces and stacked in the vertical direction. By carrying in a member P to be accommodated from an open surface of the accommodating device 1, the member P to be accommodated is held by the segment 40 arranged on the side wall 10. Since the plurality of segments 40 are arranged by being stacked in the vertical direction of the accommodating device 1, the accommodating device 1 accommodates a plurality of the members P to be accommodated by separating them away from each other in the vertical direction. Here, as a connecting member for connecting the pair of side walls 10 and 10 while a separated state is maintained, a rod-shaped member may be employed instead of the plate-shaped members used as the ceiling wall 20 and the bottom wall 30. The description of "arranged by being stacked" in this embodiment includes arrangement adjacently to each other with a slight gap provided between each of the segments.

<Side Wall 10>

The side wall 10 has a rectangular outer shape on a plan view, is provided with a rectangular flat plate portion 10a and a frame portion 10b provided on an outer periphery thereof, and can be formed by press molding of a metal plate such as iron, stainless steel and aluminum. In the flat plate portion 10a, a plurality of opening portions 12 for detachably mounting the segments 40 and screw holes 13 for mounting fixing screws 50 are formed. In this embodiment, the number of the opening portions 12 required for mounting one segment 40 is two, and the two opening portions 12 are apposed along a carrying-in/-out direction (the depth direction of the accommodating device 1) of the member P to be accommodated. Moreover, in order to arrange the plurality of segments 40 by stacking them along an inner wall surface of the flat plate portion 10a (in the vertical direction of the accommodating device 1), a plurality of the opening portions 12 are provided at a predetermined pitch in the vertical direction of the accommodating device 1. In this embodiment, the opening portions 12 are formed at 24 spots (12 pairs) in the flat plate portion 10a so that 12 segments 40 can be mounted on one side wall 10. A height dimension of each opening portion 12 in the vertical direction is adjusted to s1 (see FIG. 6). Moreover, it is only necessary that a width dimension of the opening portion 12 in the depth direction of the accommodating device 1 is slightly larger than a width dimension of a bent portion 45 which will be described later and it is not particularly limited.

Moreover, the screw holes 13 for mounting the fixing screws 50 are formed in the vicinity of the opening portions 12 formed on upper and lower end portions of the flat plate portion 10a. In this embodiment, the screw holes 13 and 13 are formed between one set of opening portions 12 and 12. The screw holes 13 are used for fixing only the segments 40 arranged on the uppermost side and the lowermost side to the wall body (flat plate portion 10a) when the plurality of segments 40 are arranged by being stacked along the inner wall surface of the side wall 10. In this embodiment, the screw opening portions 46 to be screwed with the fixing screws 50 which will be described later are provided at two spots for the one segment 40. Therefore, the screw holes 13 are formed at two spots each on upper and lower parts of the flat plate portion 10a (four spots in total).

Figure 3:
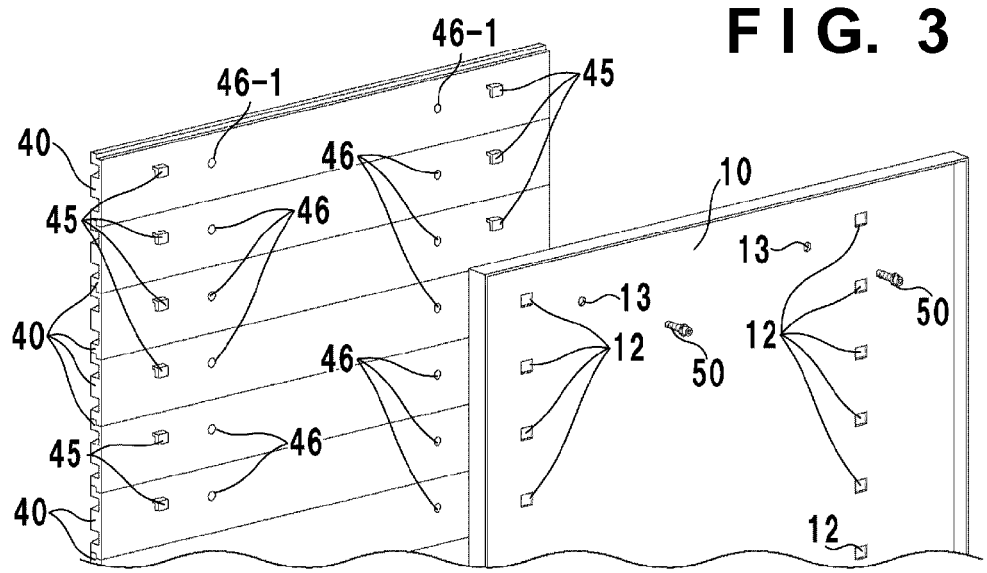
FIG. 3 is an exploded perspective view of a segment and a side wall in FIG. 1.
Figure 4A:
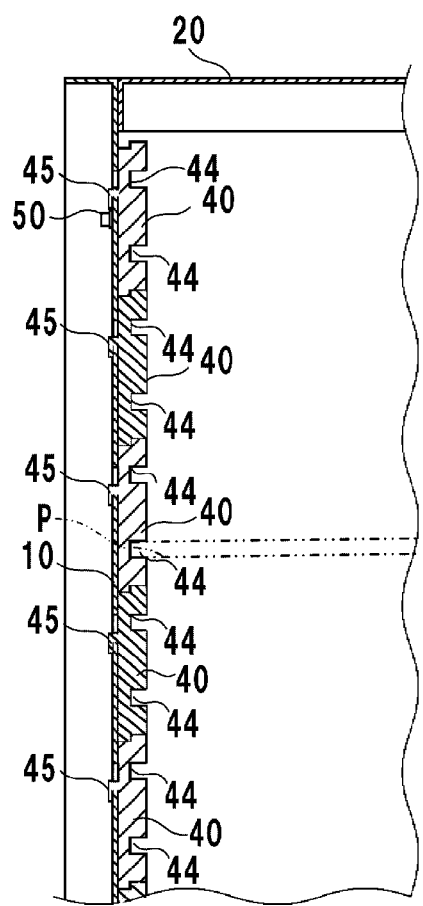
FIGS. 4A and 4B are A-A sectional views of FIG. 1.

FIG. 3 illustrates a positional relation between the segment 40 arranged on the uppermost side and the screw hole 13. The exploded perspective view in FIG. 3 illustrates a state in which the plurality of segments 40 are stacked and connected for explanation, but as will be described later, the plurality of segments 40 are mounted on the side wall 10 one by one and can be connected to each other. In FIG. 3, the screw opening portion 46 of the segment 40 arranged on the uppermost side is indicated by reference numeral 46-1 for convenience. When the segments 40 are mounted on the opening portions 12 and 12 on the uppermost side in the side wall 10, the screw opening portions 46-1 and 46-1 are made to communicate with the screw holes 13 and 13 and are screwed with the fixing screws 50. FIG. 4A illustrates a state in which the segment 40 with the fixing screw 50 arranged on the uppermost side is fixed to the side wall 10.

The frame portion 10b is provided by surrounding an outer peripheral edge of the flat plate portion 10a so as to protrude to the outside of the accommodating device 1 when the side wall 10 is assembled into the accommodating device 1. By constituting as above, on an outer side surface of the side wall 10 of the accommodating device 1, a space for accommodating a portion of the segment 40 mounted on the opening portion 12 and the fixing screw 50 mounted on the screw hole 13 can be formed, and the portion of the segment 40 and the fixing screw 50 can be protected. Moreover, rigidity of the side wall 10 can be improved.

<Ceiling Wall 20, Bottom Wall 30>

The ceiling wall 20 and the bottom wall 30 are provided with flat plate portions 20a and 30a, each having a rectangular outer shape on a plan view, and frame portions 20b and 30b provided on their outer peripheral portions similarly to the side wall 10. The frame portions 20b and 30b are formed by press molding of metal such as iron, stainless steel and aluminum. The ceiling wall 20 and the bottom wall 30 are arranged so that the frame portions 20b and 30b are installed upright on the inner side of the accommodating device 1. In this embodiment, the ceiling wall 20 and the bottom wall 30 are connecting members connecting the pair of side walls 10 arranged opposite to each other. The connection between the side walls 10 and the ceiling wall 20 as well as the bottom wall 30 is realized by welding, adhesion or connection by a fixing member such as a bolt, for example. Moreover, particularly since the frame portion 30b of the bottom wall 30 is provided in an inward direction of the accommodating device 1, when the accommodating device 1 is placed on a placing portion, not shown, the entire flat plate portion 30a of the bottom wall 30 can be brought into contact with the ground, and the accommodating device 1 can be stably placed.

<Segment 40>

Figure 5A:
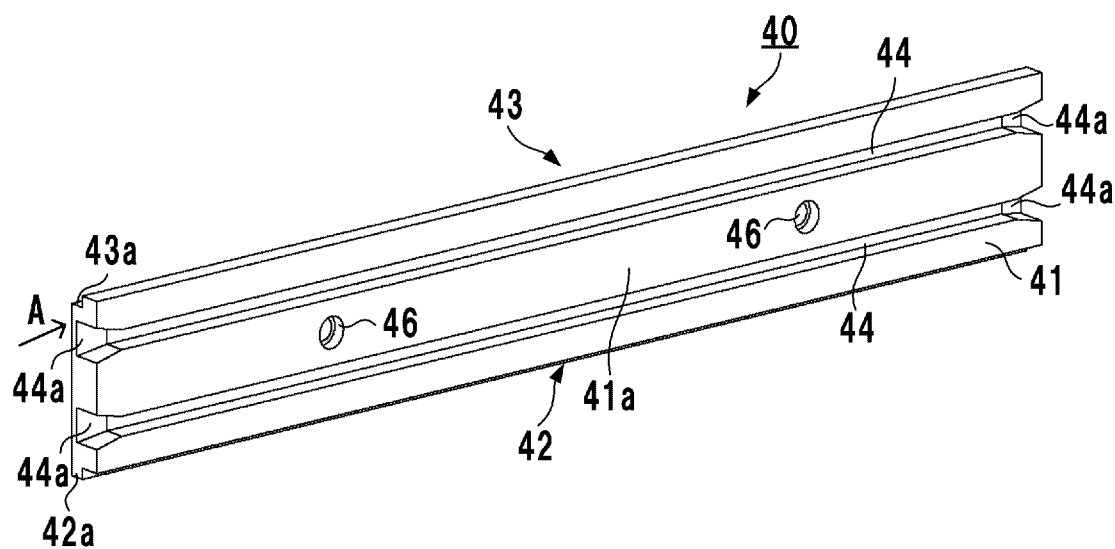
FIGS. 5A and 5B are perspective views of the segment in FIG. 1.
Figure 5B:
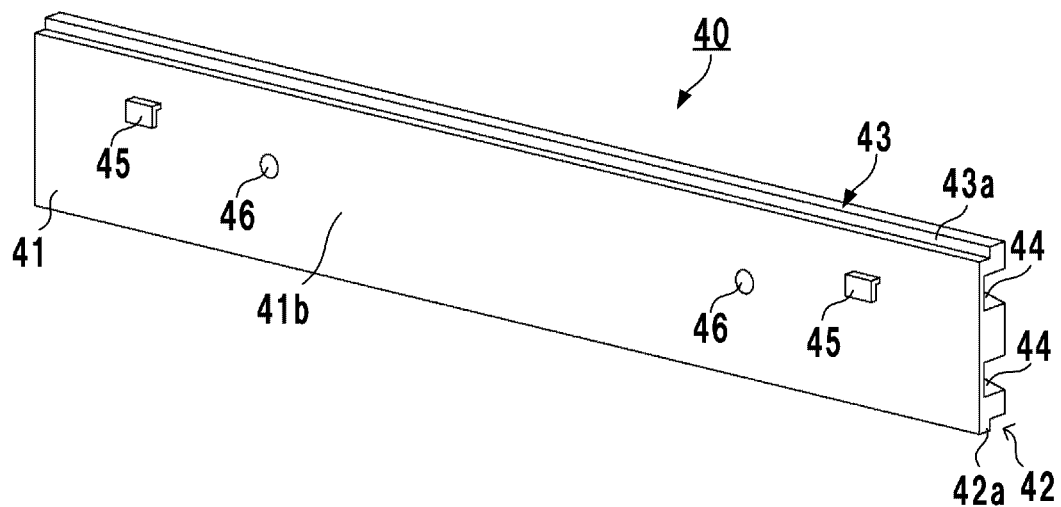
Figure 6:
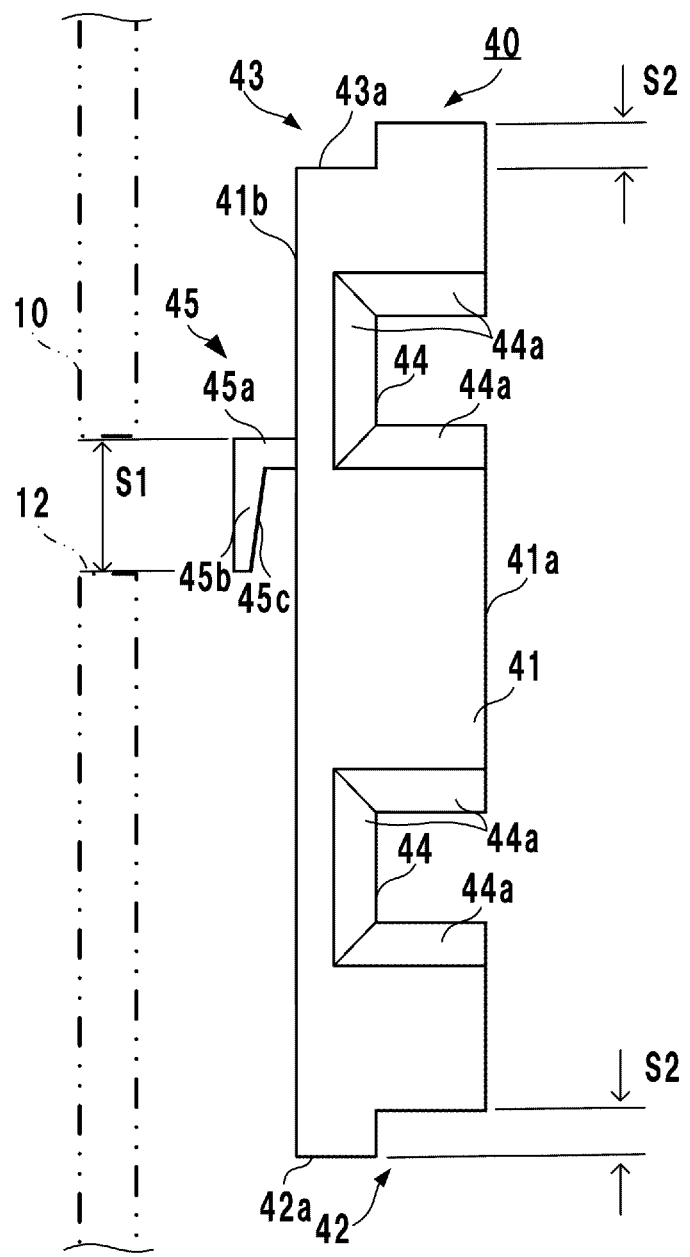
FIG. 6 is a side view of the segment in FIG. 1.

FIGS. 5A, 5B, and 6 illustrate perspective views and a side view of the segment 40. FIG. 6 is a side view of the segment 40 when seen from an arrow A direction in FIG. 5A. The segment 40 includes a body portion 41, a first engagement portion 42 and a second engagement portion 43 constituting an engagement portion, an accommodating portion 44, a bent portion 45, and the screw opening portion 46. The segment 40 is a lengthy member and is arranged by being stacked in the vertical direction of the side wall 10 so that its longitudinal direction matches a width direction of the side wall 10 (depth direction of the accommodating device 1). The body portion 41 has a length capable of accommodating an entire edge portion of the member P to be accommodated and is arranged in the accommodating device 1 by extending in the depth direction of the accommodating device 1 which is a width direction of the side wall 10. The body portion 41 includes an inner side surface 41a directed to the inner side of the accommodating device 1 and an outer side surface 41b directed to the outer side of the accommodating device 1 and in contact with the side wall 10 in a state in which the body portion 41 is arranged in the accommodating device 1.

The first engagement portion 42 and the second engagement portion 43 are provided each on both end portions of the body portion 41 in a transverse direction which is the vertical direction of the accommodating device 1. When the plurality of segments 40 are arranged by being stacked along the side wall 10, each of the segments 40 is connected to each other through the respective engagement portions. The first engagement portion 42 is formed in a stepped state on a lower end portion of the body portion 41 of the segment 40 located in a downward direction of the accommodating device 1. A protruding portion 42a extending along the wall surface is provided on the side wall 10 side which is a wall body side in the first engagement portion 42. As illustrated in FIG. 6, the protruding portion 42a is a rectangular protrusion protruding from a lower end surface of the body portion 41 in the transverse direction and is provided so as to extend along the outer side surface 41b of the body portion 41. The second engagement portion 43 is formed in a stepped state in an upper end portion of the body portion 41 of the segment 40 located in an upward direction of the accommodating device 1. A dent portion 43a formed on the side wall 10 side which is the wall body side is provided in the second engagement portion 43. The dent portion 43a is provided on the upper end portion of the body portion 41 on a side opposite to the protruding portion 42a in the transverse direction of the body portion 41, has a shape in which a part of an upper end portion of the body portion 41 is cut away on a sectional view, and is formed along the outer side surface 41b similarly to the protruding portion 42a. A protrusion height of the protruding portion 42a and a dent depth (step) in the dent portion 43a are adjusted, respectively, so as to be s2 (<s1).

The segment 40 is provided with the first engagement portion 42 engaged with the segment 40 arranged on one adjacent side and the second engagement portion 43 engaged with the segment 40 arranged on the other adjacent side. When the plurality of segments 40 are arranged by being stacked on each other, the first engagement portion 42 is engaged with the second engagement portion 43 in the segment 40 on the one side (one stage lower), while the second engagement portion 43 is engaged with the first engagement portion 42 in the segment 40 on the other side (one stage higher). At this time, the adjacent segments 40 are engaged through engagement between the protruding portion 42a of the first engagement portion 42 and the dent portion 43a of the second engagement portion 43. The first engagement portion 42 and the second engagement portion 43 have shapes complementary with each other on a longitudinal sectional view, and when they are engaged with each other, the inner side surface 41a and the outer side surface 41b of each of the adjacent segments 40 form the same plane. They are arranged by extending in the depth direction of the accommodating device 1 which is the longitudinal direction of the segment 40. The height s1 of the opening portion 12 in the vertical direction, the protruding height s2 of the first engagement portion 42, and the dent depth s2 of the second engagement portion 43b are adjusted so that a slight gap of such a degree that a hook portion 45b which will be described later does not leave the opening portion 12 is formed between the engaged protruding portion 42a and the dent portion 43a. In this embodiment, the protruding portion 42a and the dent portion 43a are formed, each having a complementary shape with a rectangular section, but this is not limiting, and a complementary shape formed having an arc section, a triangular section, a circular section and the like may be employed, for example. Moreover, in this embodiment, the example in which the first engagement portion 42 and the second engagement portion 43 are provided continuously by being extended in the longitudinal direction of the segment 40 is described, but this is not limiting. The first engagement portion 42 and the second engagement portion 43 may be provided discontinuously such that they are provided at two spots only on both end portions of the segment 40 in the longitudinal direction or at three spots or more in total on the both end portions of the segment 40 in the longitudinal direction and at least one intermediate portion, for example.

On the inner side surface 41a of the body portion 41, the accommodating portion 44 for accommodating the flat-plate shaped member P to be accommodated is formed. The accommodating portion 44 is a groove extending in the longitudinal direction of the segment 40 and having a U-shaped section open on the both end portions of the segment 40, and an inclined portion (chamfer portion) 44*a* for smooth insertion of the member P to be accommodated into the accommodating portion 44 is formed on its open end portion. In this embodiment, two rows of the accommodating portions 44 are formed in the one segment 40, and the two rows of the accommodating portions 44 are arranged in parallel by being separated from each other in the transverse direction of the segment 40. That is, the segment 40 in this embodiment can accommodate two members P to be accommodated by one segment 40. In this embodiment, the number of rows of the accommodating portions 44 to be formed in one segment 40 is two, but this is not limiting and the number may be one, three or the like. Moreover, the accommodating portion 44 is not limited to the U-shaped groove but may be formed as a protruding portion. In this case, the member P to be accommodated is accommodated in a state in which it is placed on the protruding portions on the both sides in the accommodating device 1.

On the outer side surface 41*b* of the body portion 41 on the side opposite to the inner side surface 41*a*, the bent portions 45 which are loosely-fitting units are provided at two spots in the longitudinal direction of the segment 40. The bent portion 45 is loosely fitted with the opening portion 12 which is a loosely-fitted portion provided on the side wall 10. Since the two bent portions 45 are arranged by being separated from each other in the longitudinal direction of the body portion 41, the segment 40 which is a lengthy member can be stably mounted on the side wall 10. The bent portion 45 includes an extended portion 45*a* extending perpendicularly to the outer side surface 41*b* and a hook portion 45*b* connected at a right angle to the extended portion 45*a* so as to extend downward from the extended portion 45*a*. The hook portion 45*b* is formed having a rectangular shape on a plan view as illustrated in FIG. 5B, and the bent portion 45 is formed having an inverted L-shape on an entire side view as illustrated in FIG. 6. The opening portion 12 has a rectangular shape with the same size on a plan view as the hook portion 45*b* and is set to the size capable of insertion of the hook portion 45*b*. After the hook portion 45*b* of the bent portion 45 is inserted through the opening portion 12, the bent portion 45 is loosely fitted so as to be vertically movable in the opening portion 12 within a range in which the extended portion 45*a* is brought into contact with upper and lower end portions of the opening portion 12. The hook portion 45*b* is provided with an inclined portion 45*c* in which a thickness of a side opposed to the outer side surface 41*b* is continuously reduced toward a tip end. When the bent portion 45 is moved in a downward direction in the opening portion 12, this inclined portion 45*c* guides the outer side surface 41*b* so as to get closer to a mounting surface of the side wall 10, and when a lower surface of the extended portion 45*a* abuts against a lower edge of the opening portion 12, the segment 40 is locked by the flat plate portion 10*a*. This bent portion 45 prevents removal of the segment 40 from the flat plate portion 10*a* as will be described later. In this embodiment, the example in which the bent portions 45 are arranged by being separated from each other at two spots in the longitudinal direction of the body portion 41 is described, but this is not limiting, and it can be provided only at one spot by prolonging a length of the bent portion 45 (a length of the segment 40 in the longitudinal direction). Moreover, the bent portions 45 may be arranged at three spots or more.

The bent portion 45 is arranged by being shifted on one side (the second engagement portion 43 side) from a center of the segment 40 in a direction in which the segments 40 are apposed by being stacked. In this embodiment, the bent portion 45 is arranged on an upper side from the center of the segment 40 in the transverse direction (vertical direction in FIG. 6) as illustrated in FIG. 6. By constituting as above, when the bent portion 45 is inserted through the opening portion 12, the segment 40 moves by its own weight (self-weight) downward, whereby the hook portion 45*b* and the extended portion 45*a* are hooked by the opening portion 12 and the segment 40 is suspended and at the same time, the first engagement portion 42 side moves to and abuts against the surface side of the side wall 10. Therefore, when a worker mounts the segment 40 on the side wall 10, the segment 40 is temporarily mounted on the side wall 10 easily. Moreover, movement of the first engagement portions 42 of the different segments 40 arranged adjacently to each other is prevented.

In the body portion 41, the screw opening portion 46 penetrating in its thickness direction (right-and-left direction in FIG. 6) is formed. In this embodiment, the screw opening portions 46 are arranged between the two rows of accommodating portions 44 or in other words, arranged at a center part of the segment 40 at two spots in the transverse direction by being separated from each other in the longitudinal direction of the segment 40 similarly to the bent portion 45. In this embodiment, the example of provision at two spots is described, but the screw opening portions may be provided at one or three or more spots. A screw hole to be directly screwed with the fixing screw 50 which will be described later may be formed in the screw opening portion 46, or a hole in which a screwing member such as a nut to be screwed with the fixing screw 50 is accommodated may be formed.

<Mounting Process of Segment 40 on Wall Body>

A process of mounting the segment 40 on the side wall 10 which is the wall body will be described by using FIGS. 7 and 8. In the description below, the segment 40 to be mounted first is referred to as a first segment 40-1 for convenience, and the segment 40 to be mounted after that is referred to as a second segment 40-2. The first segment 40-1 and the second segment 40-2 are both the same as the above-described segment 40. In the state illustrated in ST1 in FIG. 7, a state in which the first segment 40-1 is to be mounted on the lowermost side of the side wall 10 is illustrated. In the state ST1, the bent portion 45 of the first segment 40-1 is matched with the position of the corresponding opening portion 12 of the side wall 10 and is moved in an arrow B direction in FIG. 7 so as to insert the first segment 40-1. In a state illustrated in ST2 in FIG. 7, the state in which the first segment 40-1 has been moved in an arrow C direction after the bent portion 45 is inserted through the opening portion 12 of the side wall 10 is illustrated. By means of movement of the first segment 40-1 in the arrow C direction, the hook portion 45*b* of the bent portion 45 is engaged with and guided by the side wall 10 on the lower side of the opening portion 12, and the first segment 40-1 is locked by the side wall 10. As a result, mounting of the segment 40 (the first segment 40-1) on the lowermost stage is completed, and the accommodating portions 44 on the first stage and the second stage are formed. At this time, positions of the screw opening portion 46, the screw hole 13, the opening portion 12, and the bent portion 45 are adjusted so that the screw opening portion 46 formed in the first segment 40-1 communicates with the screw hole 13 formed in the side wall 10.

A state illustrated in ST3 in FIG. 8 illustrates a state in which the second segment 40-2 is further mounted above the first segment 40-1 mounted in ST2 in FIG. 7. In the case of the second segment 40-2, too, similarly to the first segment 40-1, the bent portion 45 is inserted through the opening portion 12 of the side wall 10 and then, the segment 40-2 is moved downward. In this way, the hook portion 45b of the bent portion 45 is engaged with and guided by the side wall 10 on the lower side of the opening portion 12, and the second segment 40-2 is locked by the side wall 10. Regarding the second segment 40-2, when the hook portion 45b is locked by the side wall 10, the first engagement portion 42 of the second segment 40-2 is engaged with the second engagement portion 43 of the first segment 40-1.

Here, a state of specific engagement between the two segments will be described by referring to FIGS. 9A and 9B. FIG. 9B is a B-B sectional view illustrated in ST4 in FIG. 8. FIG. 9A illustrates a state in which the bent portion 45 of the second segment 40-2 is inserted through the opening portion 12 of the side wall 10. In this state, the hook portion 45b of the bent portion 45 has not been locked by the lower side of the opening portion 12 yet. Moreover, the protruding portion 42a of the first engagement portion 42 located on a lower end (lower side in FIG. 9A) of the second segment 40-2 has not been engaged with the dent portion 43a of the second engagement portion 43 located on an upper end of the opposing first segment 40-1. Next, the second segment 40-2 is moved to the first segment 40-1 side (one direction indicated by an arrow D in FIG. 9A). At that time, the hook portion 45b of the second segment 40-2 is engaged with the lower side of the opening portion 12 and the protruding portion 42a of the second segment 40-2 is engaged with and connected to the dent portion 43a of the first segment 40-1. Next, the first engagement portion 42 of the second segment 40-2 is engaged with and connected to the second engagement portion 43 of the first segment 40-1, and the inner side surface 41a of each segment forms the same plane (see FIG. 9B). In this way, the second segment 40-2 is engaged with the side wall 10 by the hook portion 45b and stably locked by the side wall 10 by engagement of the first engagement portion 42 with the second engagement portion 43 of the first segment 40-1, and removal from the side wall 10 is prevented. As a result, mounting of the segment 40 (the second segment 40-2) on the second stage from the bottom is completed, and the accommodating portions 44 on the third and fourth stages are formed.

It is known that the two segments 40-1 and 40-2 are locked by the plurality of opening portions 12 provided in the side wall 10 at a predetermined pitch (see FIG. 9B and ST4 in FIG. 8). At this time, a gap d is formed in an engagement surface between the second engagement portion 43 of the segment 40-1 and the first engagement portion 42 of the segment 40-2. Moreover, the accommodating portion 44 for accommodating the member P to be accommodated is formed on the inner side surfaces 41a of the segments 40-1 and 40-2, and by stacking and arranging the plurality of segments 40-1 and 40-2 vertically along the side wall 10, the accommodating portions 44 in a plurality of stages are formed on the side wall 10. As described above, after the segments are connected to each other by engaging the second segment 40-2 with the adjacent first segment 40-1, the new segments 40 (a third segment, a fourth segment and the like) are arranged so as to be further adjacent to the second segment 40-2. By repeating this process, the accommodating portions 44 in a plurality of stages can be formed along the vertical direction of the wall surface of the side wall 10.

Figure 4B:
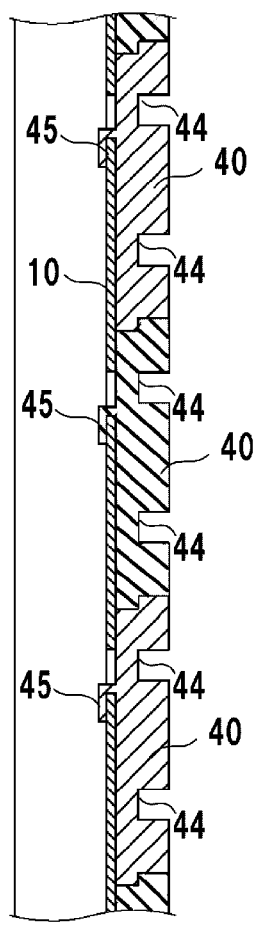
Figure 10:
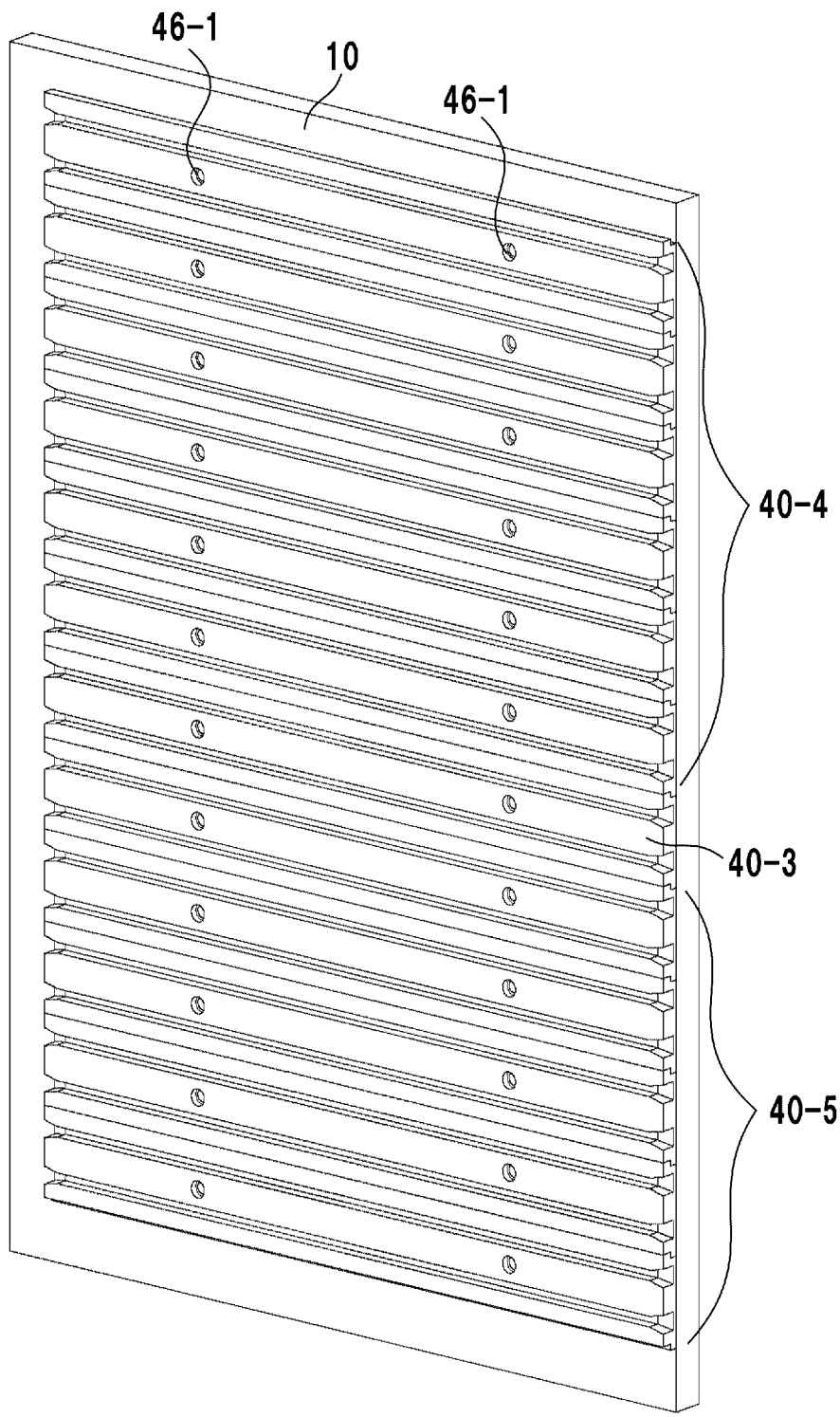
FIG. 10 is a perspective view when a plurality of the segments are mounted on the side wall.
Figure 11:
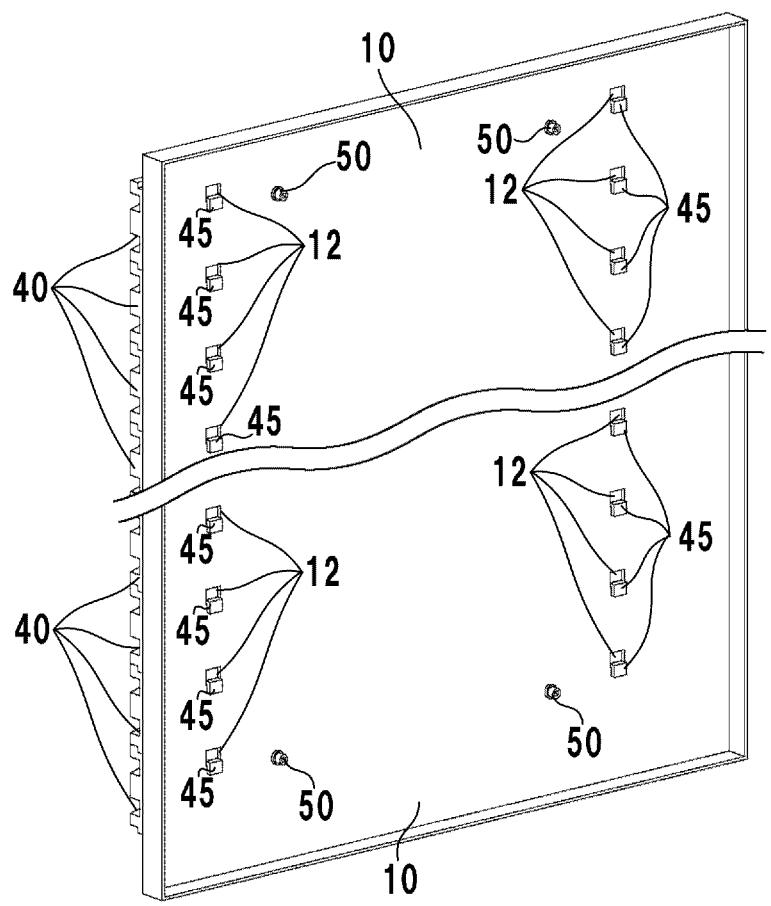
FIG. 11 is a perspective view when the side wall in FIG. 10 is seen from an outside.

As described above, as illustrated in FIG. 10, the segments 40 are arranged over the entire wall surface of the side wall 10. Moreover, FIG. 11 illustrates that the segments 40 located on the uppermost side and the lowermost side with respect to the side wall 10 and the side wall 10 are fixed to each other by the fixing screws 50. In this way, removal of the plurality of segments 40 connected to each other in the connected state from the side wall 10 can be prevented. That is, as illustrated in FIG. 4B, each of the plurality of segments 40 is connected to each other while its vertical movement is regulated by the first engagement portion 42 and the second engagement portion 43 and its removal from the side wall 10 is also regulated. Therefore, by fixing at least the segment 40 located on the uppermost side to the side wall 10, the plurality of segments as a whole is prevented from being removed from the side wall 10. Moreover, by fixing the segment 40 located on the lowermost side to the side wall 10 by the fixing screw 50, removal of the segment 40 on the lowermost side from the side wall 10 of the first engagement portion 42 can be prevented, and the segment having the same shape as that of the segment 40 to be arranged in the intermediate portion can be employed as the segment 40 located on the lowermost side.

Moreover, in this embodiment, the engagement between the hook portion 45b and the lower end of the opening portion 12 is used for alignment in the vertical direction of the plurality of segments 40. Moreover, since the engagement between the hook portion 45b and the lower end of the opening portion 12 is not for firmly fixing the segment 40 and the side wall 10 to each other, they can be engaged with a small force. Moreover, connection between the first engagement portion 42 and the second engagement portion 43 of the adjacent two segments 40 and 40 is not for firmly fixing the segment 40 to the side wall 10 or for firmly connecting the segments 40 to each other. The connection between the first engagement portion 42 and the second engagement portion 43 is connection used for regulating movement of each of the segments 40 and thus, they can be connected with a small force. Therefore, work time for mounting of the large number of segments 40 on the side wall 10 or connection between each can be reduced, and manufacture time of the accommodating device 1 can be reduced.

Moreover, in this embodiment, the segment 40 requiring replacement can be easily replaced after completion. Such replacement method will be described by referring to FIG. 10. The segment 40 to be replaced is indicated by reference numeral 40-3 for convenience in FIG. 10, and a case in which the segment 40-3 is broken and this is to be replaced will be described. A group of the plurality of segments located above this segment 40-3 is referred to as a plurality of segments 40-4, while a group of the plurality of segments located below the segment 40-3 is referred to as a plurality of segments 40-5. The segment 40-3, the plurality of segments 40-4, and the plurality of segments 40-5 are all constituted by the same members as that of above-described segments 40.

When the segment 40-3 is to be replaced, first, fastening between the segment 40 located on the uppermost side (the upper stage) of the plurality of segments 40-4 and the side wall 10 is released by removing the fixing screw 50 from the screw opening portion 46-1. Next, the plurality of segments 40-4 and the segment 40-3 to be replaced are slid to an upper stage direction of the side wall 10 altogether, and a connected state by the engagement portions between the engagement portions 43 of the plurality of segments 40-5 and the engagement portion 42 of the segment 40-3 to be replaced is released. At this time, it may be performed in a state in which the plurality of segments 40-4 and the segment 40-3 to be replaced are not inadvertently removed from the side wall 10 (a state in which the side wall 10 is changed from a longitudinal attitude to a lateral attitude, for example). In this way, only the segment 40-3 to be replaced can be removed from the side wall 10. By sliding the segment 40-3 in the upper stage direction along the side wall 10 and by removing the hook portion 45b from the corresponding opening portion 12, removal of the segment 40-3 is completed, and this is to be replaced with a new segment 40.

The hook portion 45b of the newly replaced segment 40 is inserted into the corresponding opening portion 12, the second engagement portion 43 of the replaced segment 40 is engaged with the first engagement portions 42 of the plurality of segments 40-4, and the plurality of segments 40-4 are slid to a lower stage direction along the side wall 10 again together with the replaced segment 40 so that the replaced segment 40 is engaged with and connected to the second engagement portions 43 of the plurality of segments 40-5. After that, by fastening and fixing the segment 40 located on the uppermost side (the upper stage) of the plurality of segments 40-4 to the side wall 10 by the fixing screw 50, the replacement work of the segment is finished. In this way, even if the segment 40-3 located in an arbitrary intermediate stage in the plurality of segments 40 arranged by being stacked is broken, there is no need to remove all the segments 40 one by one from the side wall 10 for replacement but only the segment 40-3 needs to be replaced. That is, only the segment 40-3 to be replaced can be partially removed and replaced and thus, efficiency of replacement and mounting works of the segments can be improved. Therefore, according to the accommodating device 1 of this embodiment, the accommodating portions 44 can be partially replaced easily. That is, efficiency of the mounting work of the accommodating portion of the accommodating device can be improved.

Second Embodiment

FIG. 12A illustrates an exploded perspective view of a segment 47 and the side wall 10 which are a second embodiment of the present invention. In this embodiment, the smaller segment 47 obtained by dividing the segment 40 illustrated in the first embodiment into two parts in a width direction of the side wall 10 is employed. By reducing the size of the segment 47, if the segment 47 is a resin formed product or the like, for example, deformation such as a sink and a warp of the segment 47 can be reduced. Since the two opening portions 12 are formed in the side wall 10 of this embodiment for one segment 47, four opening portions 12 for arranging two segments 47 are formed in the width direction of the side wall 10 and 24 pairs of the opening portions 12 are formed at 48 spots in total. Though not shown, the segment 47 is provided with two accommodating portions 44 and two bent portions 45 and 45 similarly to the segment 40 in the first embodiment.

As in this embodiment, by employing the segment 47 with the size in the width direction smaller than the segment of the first embodiment in the width direction of the side wall 10, even if the segment 47 is broken, the segment 47 to be replaced can be a smaller component. Moreover, by arranging the segments 47 provided with the accommodating portions 44 having different vertical position relations on one side and the other side in the width direction of the side wall 10, respectively, for example, two types of objects to be accommodated with different heights in the vertical direction can be accommodated.

Third Embodiment

FIG. 12B illustrates an exploded perspective view of a segment 48 and the side wall 10 which are a third embodiment of the present invention. In this embodiment, four segments 40, 40, 40, and 40 in the first embodiment are joined together as the one segment 48. The number of the opening portions 12 provided in the side wall 10 is two for each segment 48 at this time. Therefore, in the side wall 10 of this embodiment, the opening portions 12 are provided at six spots (three pairs) in total. In the segment 48 of this embodiment, the bent portions 45 and 45 (not shown) are provided at two spots close to the screw opening portion 46 located on the uppermost side, and the screw opening portions 46 are provided at four spots in total on upper and lower parts. In this way, the segments 48 can be collectively mounted, and a mounting work can be performed rapidly.

Fourth Embodiment

Figure 13:
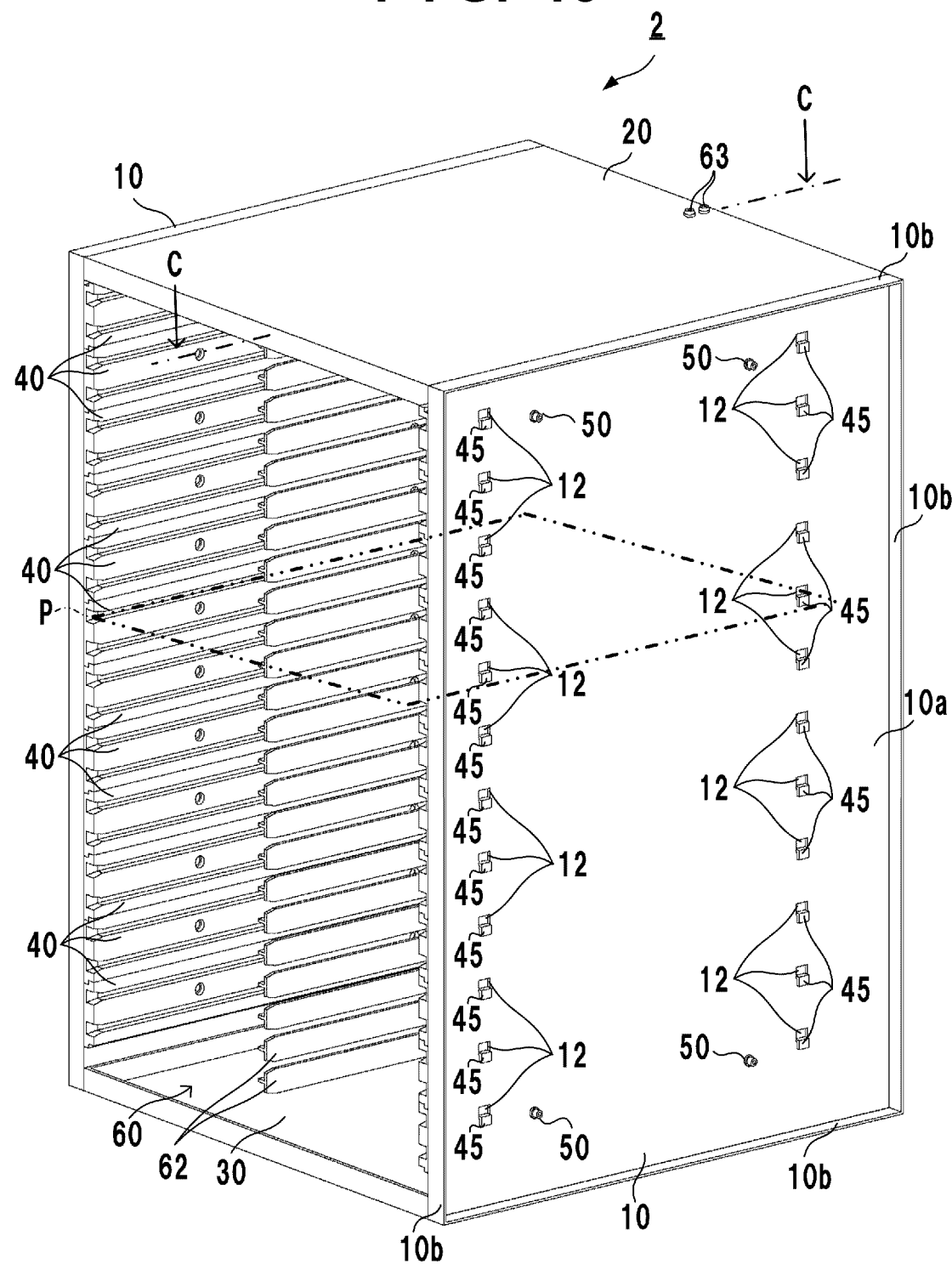
FIG. 13 is a perspective view of an accommodating device of a fourth embodiment of the present invention.
Figure 14:
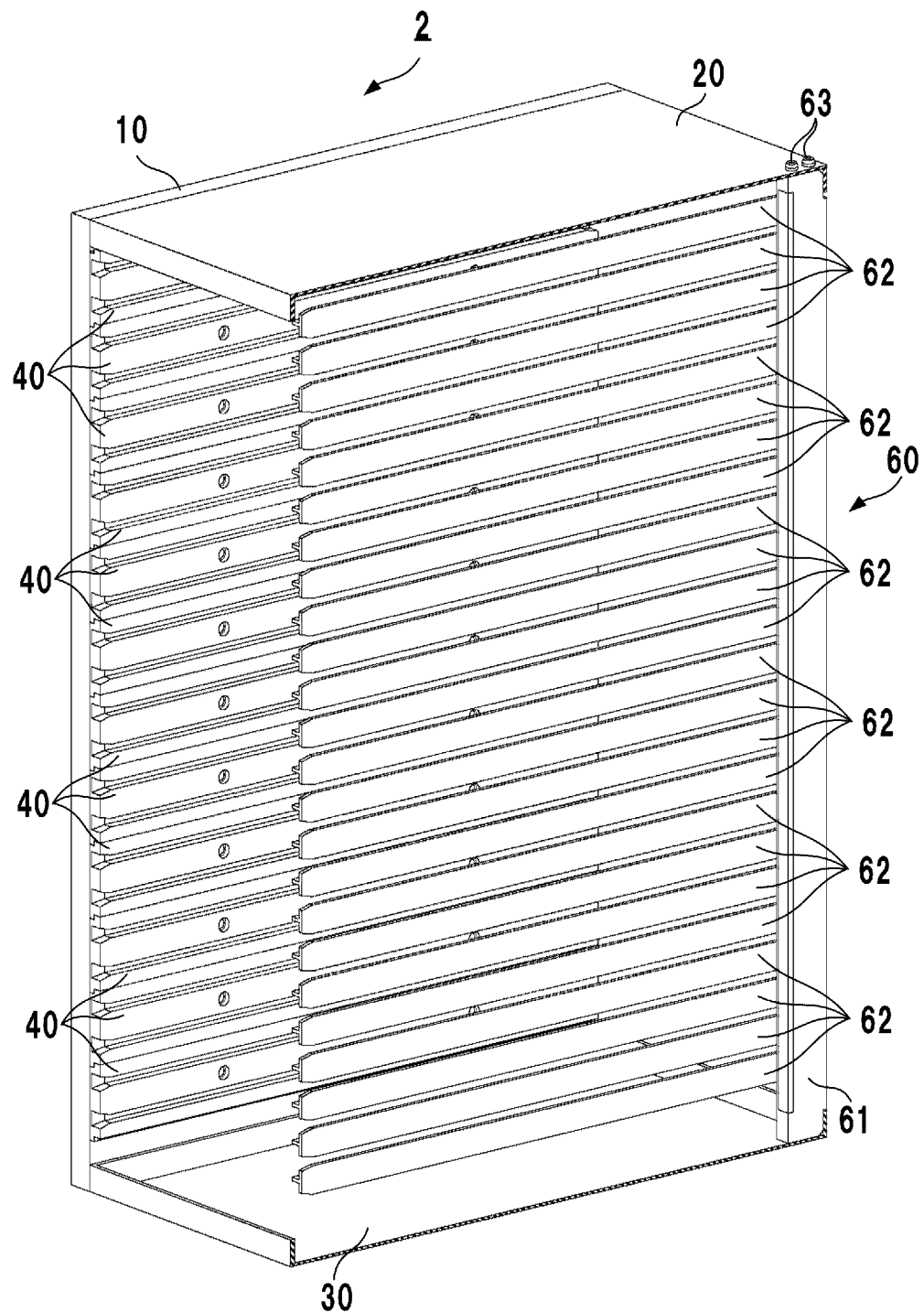
FIG. 14 is a partially cutaway perspective view of the accommodating device in FIG. 13.
Figure 15:
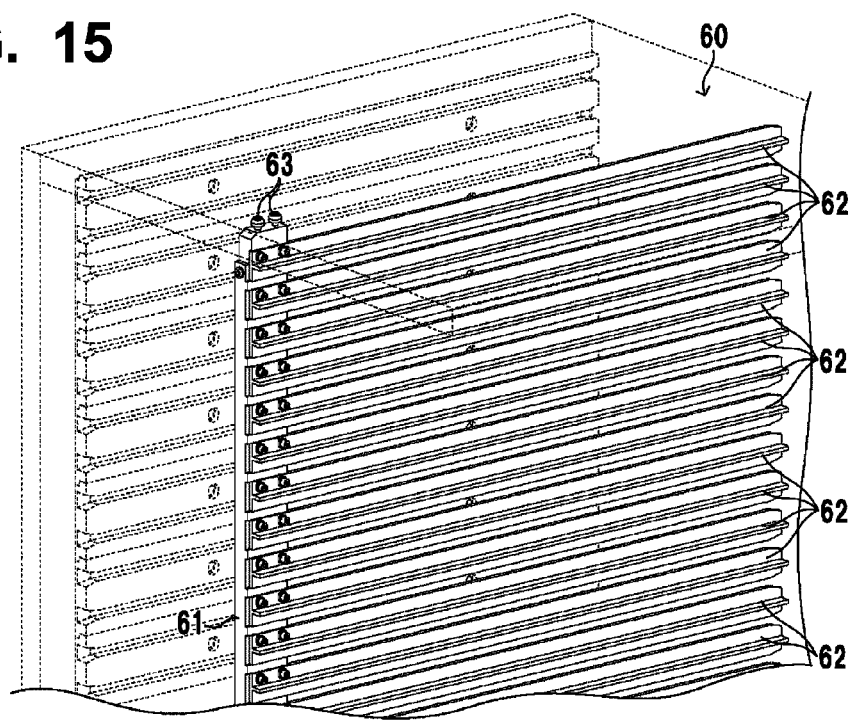
FIG. 15 is a perspective view of an intermediate holding member in FIG. 13.

FIGS. 13 to 16 illustrate an accommodating device 2 which is a fourth embodiment of the present invention. FIG. 13 is a perspective view of the accommodating device 2 in this embodiment. In this embodiment, the accommodating device 2 includes an intermediate holding member 60 at an intermediate position of the two side walls 10 opposed to each other. By referring to FIG. 13, a plurality of separating members 62 of the intermediate holding member 60 are respectively constituted so as to hold the intermediate portions of the members P to be accommodated, each being formed having a T-shaped section. As illustrated in FIGS. 14 and 15, the intermediate holding member 60 includes a mounting member 61 mounted on the accommodating device 2 and a plurality of separating members 62 supported by the mounting member 61. The mounting member 61 is fixed to the ceiling wall 20 and the bottom wall 30 of the accommodating device 1 by a fixing screw 63. In this embodiment, the mounting member 61 is mounted/fixed to one end portions of the ceiling wall 20 and the bottom wall 30 of the accommodating device 1 in a carrying-in/out direction of the member P to be accommodated.

Figure 16:
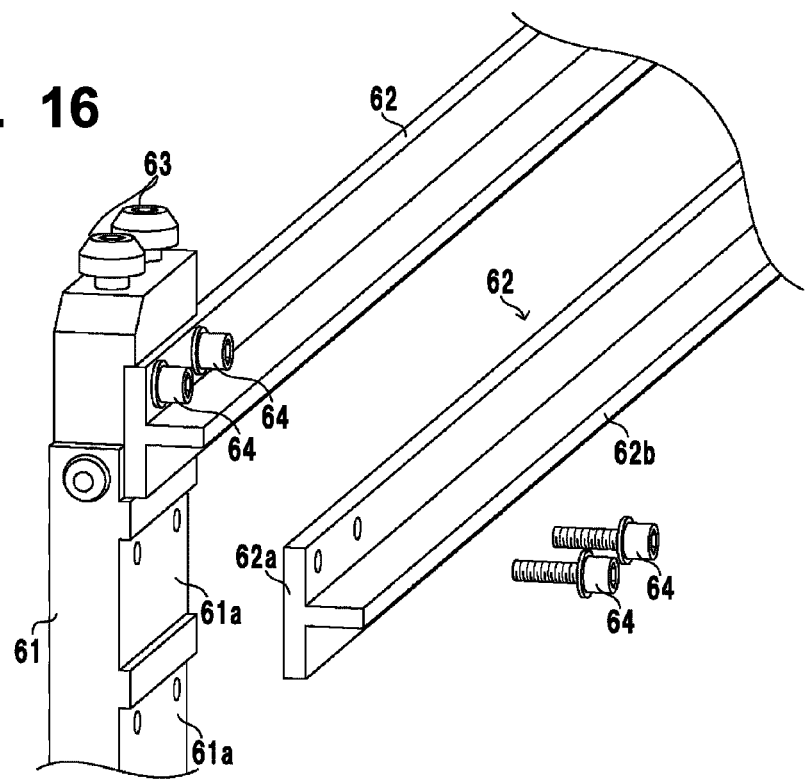
FIG. 16 is a partially exploded perspective view of the intermediate holding member in FIG. 15.

As illustrated in a partially exploded perspective view in FIG. 16, the separating member 62 is mounted on the mounting member 61 by a screw 64 by causing a plane portion 62a having a T-shaped section to abut against the side surface of the mounting member 61. In the mounting member 61, a recess portion 61a for accommodating the plane portion 62a of the separating member 62 is formed, and vertical alignment of the plurality of separating members 62 is made by accommodating the separating member 62 in this recess portion 61a to regulate movement. Moreover, the separating member 62 is prevented from shifting to the direction of the side wall 10 of the accommodating device 2 by a rib portion 62b protruded from the plane portion 62a. In this embodiment, the separating member 62 is supported in a cantilever state in which one end portion is mounted on the mounting member 61, but this is not limiting, and it may be so configured that the mounting member 61 is mounted/fixed to center parts of the ceiling wall 20 and the bottom wall 30 of the accommodating device 1 in the carrying-in/out direction of the member P to be accommodated, and a center part of the separating member 62 is supported by this mounting member 61, for example.

In the above-described first to fourth embodiments, the accommodating devices 1 and 2 have rectangular shapes on a front view, and a device for accommodating the carried-in member P to be accommodated by horizontally stacking them is illustrated, but this is not limiting. For example, the accommodating device 1 may have an opening with a parallelogram shape on a front view through which the member P to be accommodated is carried in for accommodating the members P to be accommodated by horizontally stacking them or may accommodate them with inclination in correspondence with a placed surface, not shown.

Moreover, the side wall 10, the ceiling wall 20, and the bottom wall 30 are exemplified as ones obtained by press molding of metal such as iron, stainless steel and aluminum, but this is not limiting, and it may be resin forming such as plastic, fiber-reinforced composite material, lumber and the like.

As a material for the segment 40, resin forming can be so as not to damage the member P to be accommodated. However, lumber, fiber-reinforced composite materials and the like can be exemplified as a material other than the above. Moreover, as a material for the segment 40, metal such as iron, stainless steel and aluminum may be used. Furthermore, the number of the segments 40 to be mounted on the accommodating devices 1 and 2 and the numbers of the opening portions 12 and the screw holes 13 provided in the side wall 10 may be set as appropriate by a user in accordance with its application and are not limited to the numbers exemplified in this embodiment. The number of the accommodating portions 44 provided in one segment 40 is similarly set as appropriate by the user in accordance with its application and is not limited to the number exemplified in this embodiment.

In this embodiment, the segments 40 used on the uppermost side and on the lowermost side of the wall surface are the same segments 40 as the others located in the middle, but this is not limiting. The segment 40 to be located on the uppermost side of the wall surface may be a segment without the second engagement portion 43. Moreover, the segment 40 to be located on the lowermost side may be a segment without the first engagement portion 42.

Moreover, in this embodiment, the segments 40 are arranged on the side wall 10 so as to accommodate the members P to be accommodated in the horizontal direction, but this is not limiting. For example, the segments 40 may be arranged on inner side surfaces 41a of the ceiling wall 20 and the bottom wall 30 so as to arrange a plurality of the plate-shaped members P to be accommodated upright in the perpendicular direction in the accommodating device 1. At this time, the frame portions 20b and 30b of the ceiling wall 20 and the bottom wall 30 can be provided so as to protrude toward an outer side of the accommodating device 1.

Fifth Embodiment

The accommodating device is required to basically accommodate the member P to be accommodated in an accommodated state with predetermined attitude and interval, and the segment in the accommodating device is required to have high dimensional accuracy and a light weight so that a weight of the entire accommodating device does not become heavy. Moreover, when heat treatment is applied to the member P to be accommodated, the heat treatment might be applied also to the accommodating device to have accommodated the member P to be accommodated in some cases. At this time, the segment in the accommodating device requires heat resistance. In addition, taking-in/out of the member P to be accommodated might be performed frequently, and the accommodating portion of the segment (a portion in contact with the member P to be accommodated) requires abrasion resistance.

Thus, in this embodiment, a segment body is formed from a lightweight aluminum material with excellent heat resistance, electroless Ni (nickel) plating with nickel as a main component is applied to this segment body made of aluminum, and a plating film is formed on a surface of the segment body so as to obtain a segment with excellent abrasion resistance. Heat treatment is applied as appropriate to the segment after the plating. The plating film can have a film thickness of 25 to 50 μm, for example. If the film thickness is less than 25 μm, sufficient hardness which will be described later cannot be obtained, while if 50 μm is exceeded, it takes a higher manufacturing cost.

Moreover, a plating film which is capable of plating with a uniform thickness over the entire surface of the segment body and is inexpensive, and has sufficiently high contact strength between the segment body and the plating film is selected. In addition, a combination of the segment body and the plating film is suitable if Vickers hardness of the plating film (or the segment surface) after the heat treatment is 800 Hv or more. If the Vickers hardness is less than 800 Hv, abrasion resistance is insufficient. By providing the plating film on the surface of the segment body as above, abrasion resistance of the segment is improved, thereby durability of the segment is improved. Since the segment can no longer be chipped easily, adhesion of dusts or the like generated from the segment to the member P to be accommodated can be prevented, and the dimensional accuracy can be maintained high.

Sixth Embodiment

The accommodating device is required to basically accommodate the member P to be accommodated in an accommodated state with predetermined attitude and interval, and the segment in the accommodating device is required to have high dimensional accuracy and a light weight so that a weight of the entire accommodating device does not become heavy. Moreover, if the member P to be accommodated is a completed substrate or the like, in order to prevent charging by static electricity generated by contact and rubbing between the accommodating portion of the segment and the member P to be accommodated, the segment in the accommodating device requires high electrical conductivity and high abrasion resistance.

Thus, in this embodiment, the segment is formed from a resin in which a conductive filler (carbon filler) is mixed in a resin such as engineering plastic. As the resin constituting the segment, modified PPE can be employed for the engineering plastic, for example. A mixing ratio of the conductive filler in the constituent resin of the segment is selected as appropriate so that a distortion (warp) amount of a product in resin forming becomes a desired value or less, which can be 5 to 30 mass %, for example. If the mixing ratio is less than 5 mass %, sufficient conductivity and low frictional properties which will be described later cannot be obtained, while if 30 mass % is exceeded, dimensional accuracy in resin forming cannot be ensured easily.

Heat resistance, high dimensional accuracy, and light weight can be realized by employing the resin such as engineering plastic as the constituent resin of the segment. Moreover, the segment can realize high conductivity and low frictional properties by containing a conductive filler. By constituting as above, the member P to be accommodated such as a substrate held by the segment can be prevented by the high conductivity of the segment from being charged. Moreover, since the segment itself has low frictional properties, the segment is not worn easily and as a result, durability of the segment is improved. Since the segment is no longer chipped easily, the dusts or the like generated from the segment is prevented from adhering to the member P to be accommodated. The constituent resin material, the mixing ratio of the filler, the shape of the filler (length and diameter) and the like in the segment are not limited to those described above but are set as appropriate in accordance with properties and characteristics required for the segment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application Nos. 2014-130659, filed Jun. 25, 2014, and 2015-082045, filed Apr. 13, 2015, which are hereby incorporated by reference herein in their entirety.

What is claimed is:

1. An accommodating device provided with a plurality of accommodating portions configured to accommodate plate-shaped members to be accommodated by being separated away in a thickness direction thereof, comprising:
  at least one wall body constructing said accommodating device; and
  a plurality of segments having said accommodating portions respectively and arranged adjacently each other along a wall surface of said wall body, wherein
  each of said plurality of segments has a first engagement portion to be engaged with one adjacent segment on one side and a second engagement portion to be engaged with the other adjacent segment on the other side in an opposite direction to the one side, and
  said plurality of segments are connected to each other through said first and second engagement portions and are detachably mounted on said wall body,
  said first engagement portion has a protruding portion engaged with said second engagement portion of said one adjacent segment on the one side and extending along said wall body,
  said second engagement portion has a dent portion engaged with said first engagement portion of said other adjacent segment on the other side and provided on wall body side,
  each of said plurality of segments is formed from a resin in which conductive filler is mixed in modified PPE, and
  a mixing ratio of the conductive filler in the resin is in 5 to 30 mass %.

2. The accommodating device according to claim 1, wherein
  said first engagement portion and said second engagement portion are extended in a depth direction of said accommodating portions.

3. The accommodating device according to claim 1, wherein
  said plurality of segments are arranged by being stacked along a wall surface of said wall body,
  each of said plurality of segments further has a loosely-fitting unit configured to be loosely fitted with said wall body, and
  said wall body has at least one loosely-fitted portion configured to be loosely fitted with said loosely-fitting unit.

4. The accommodating device according to claim 3, wherein
  said loosely-fitting unit has a bent portion including:
  an extended portion extended from said segment; and
  a hook portion connected to said extended portion and preventing removal of said segment from said wall body,
  said loosely-fitted portion includes an opening portion through which said hook portion is capable of being inserted, and
  a plurality of said opening portions are provided on the wall surface at a predetermined pitch along a direction in which said plurality of segments are apposed.

5. The accommodating device according to claim 3, wherein
  said loosely-fitting unit is arranged closer to one side of said segment from a center thereof in a direction in which said plurality of segments are apposed.

6. The accommodating device according to claim 1, wherein
  said accommodating device further includes:
  a plurality of said wall bodies arranged opposed to each other; and
  a connecting member configured to connect said plurality of wall bodies.

7. The accommodating device according to claim 6, further comprising:
  an intermediate holding member arranged at an intermediate position of two wall bodies opposed to each other in said plurality of wall bodies; wherein
  said intermediate holding member includes:
  a mounting member mounted on said accommodating device; and
  a plurality of separating members each holding an intermediate portion of said mounting member to be accommodated and supported by said mounting member.

8. A segment constructing an accommodating device provided with a plurality of accommodating portions on a wall surface of a wall body, each accommodating a plate-shaped member to be accommodated by being separated away in a thickness direction thereof, wherein
  a plurality of said segments are arranged adjacently each other along said wall surface of said wall body, and
  said segment includes:
  at least one of said plurality of accommodating portions configured to accommodate said member to be accommodated;
  a first engagement portion to be engaged with one adjacent segment on one side;
  a second engagement portion to be engaged with the other adjacent segment on the other side in an opposite direction to the one side; and
  a loosely-fitting unit configured to be detachably and loosely fitted with said wall surface of said wall body, wherein
  said first engagement portion has a protruding portion engaged with said second engagement portion of said one adjacent segment on the one side and extending along said wall body,
  said second engagement portion has a dent portion engaged with said first engagement portion of said other adjacent segment on the other side and provided on wall body side,
  said segment is formed from a resin in which conductive filler is mixed in modified PPE, and
  a mixing ratio of the conductive filler in the resin is in 5 to 30 mass %.

9. The segment according to claim 8, wherein
at least one of said plurality of segments includes said loosely-fitting unit to be loosely fitted with a loosely-fitted portion provided on said wall body,
said loosely-fitting unit has a bent portion including:
an extended portion extended from said segment; and
a hook portion connected to said extended portion and preventing removal of said segment from said wall body.

\* \* \* \* \*